US012733302B2

(12) United States Patent
Lo et al.

(10) Patent No.: US 12,733,302 B2
(45) Date of Patent: Sep. 8, 2026

(54) MICRO LIGHT-EMITTING ELEMENT, MICRO LIGHT-EMITTING DISPLAY DEVICE INCLUDING THE SAME, AND METHOD FOR MANUFACTURING THE SAME

(71) Applicant: PlayNitride Display Co., Ltd., Zhunan Township Miaoli County (TW)

(72) Inventors: Yu-Yun Lo, Zhunan Township (TW); Bo-Wei Wu, Zhunan Township (TW); Yen-Yeh Chen, Zhunan Township (TW); Chih-Ling Wu, Zhunan Township (TW)

(73) Assignee: PLAYNITRIDE DISPLAY CO., LTD., Zhunan Township Miaoli County (TW)

( * ) Notice: Subject to any disclaimer, the term of this patent is extended or adjusted under 35 U.S.C. 154(b) by 364 days.

(21) Appl. No.: 18/522,804

(22) Filed: Nov. 29, 2023

(65) Prior Publication Data

US 2025/0098373 A1 Mar. 20, 2025

(30) Foreign Application Priority Data

Sep. 14, 2023 (TW) ................................ 112134996

(51) Int. Cl.
*H01L 33/46* (2010.01)
*H10H 20/841* (2025.01)
(Continued)

(52) U.S. Cl.
CPC .......... *H10H 20/841* (2025.01); *H10W 90/00* (2026.01); *H10H 20/034* (2025.01)

(58) Field of Classification Search
CPC .... H10H 20/841; H10H 20/034; H10H 29/49; H10H 29/842; H10H 29/8421; H10H 20/8314; H10H 20/835; H10H 29/8325; H10H 20/82; H10H 20/84; H10H 20/819; H10H 29/39; H10W 90/00; H01L 25/167
See application file for complete search history.

(56) References Cited

U.S. PATENT DOCUMENTS

| | | | | |
|---|---|---|---|---|
| 2008/0251800 A1* | 10/2008 | Bergmann | ........... | H10H 20/018<br>257/E29.094 |
| 2023/0307584 A1* | 9/2023 | Tonkikh | ............... | H10H 29/142 |

* cited by examiner

*Primary Examiner* — Ermias T Woldegeorgis
(74) *Attorney, Agent, or Firm* — Birch, Stewart, Kolasch & Birch, LLP

(57) ABSTRACT

A micro light-emitting element is provided. The micro light-emitting element includes a first-type semiconductor having a bottom surface and a light-emitting layer disposed on the first-type semiconductor. The micro light-emitting element also includes a second-type semiconductor disposed on the light-emitting layer and an intrinsic semiconductor disposed on the second-type semiconductor and made of the same material as the second-type semiconductor. The intrinsic semiconductor has a top surface relative to the bottom surface. The sidewalls of the first-type semiconductor, the light-emitting layer, the second-type semiconductor, and the intrinsic semiconductor form a continuous side surface, and the side surface connects the bottom surface to the top surface. The micro light-emitting element further includes a metal reflecting layer disposed on the side surface and laterally covering the sidewalls of the intrinsic semiconductor and the portion of the second-type semiconductor that is adjacent to the intrinsic semiconductor.

18 Claims, 8 Drawing Sheets

(51) Int. Cl.

| | |
|---|---|
| ***H10W 90/00*** | (2026.01) |
| *H10H 20/01* | (2025.01) |

MICRO LIGHT-EMITTING ELEMENT, MICRO LIGHT-EMITTING DISPLAY DEVICE INCLUDING THE SAME, AND METHOD FOR MANUFACTURING THE SAME

CROSS REFERENCE TO RELATED APPLICATIONS

This Application claims priority of Taiwan Patent Application No. 112134996, filed on Sep. 14, 2023, the entirety of which is incorporated by reference herein.

BACKGROUND OF THE INVENTION

Field of the Invention

The embodiments of the present disclosure relate to a micro light-emitting element, and, in particular, to a vertically stacked light-emitting element, a micro light-emitting display device including the same, and a method for manufacturing the same.

Description of the Related Art

Recently, as the widespread use of micro displays is becoming a market trend, the size of micro light-emitting diodes (micro LED, mLED/μLED) must be further reduced in order to significantly improve resolution.

Vertically stacked micro light-emitting diodes are considered one of the solutions that can meet the above-mentioned needs. However, in order not to affect epitaxial quality and conductivity, the light-guiding patterns of vertically stacked micro light-emitting diodes are formed by additional processing. For example, dry etching is a common process which can expose the doped semiconductor layers while forming light-guiding patterns on the top surface of micro light-emitting diodes. However, dry etching is anisotropic. When forming light-guiding patterns using dry etching, it is not easy to keep the applied energy uniform, and this may lead to inconsistencies in the top shape of each micro light-emitting element, as well as thickness variations, thus creating quality issues such as non-uniform light patterns and uneven brightness (Mura).

Moreover, due to process factors, when vertically stacked micro light-emitting elements are bonded to a circuit substrate, they are mostly arranged with the N-side (the side close to the N-type semiconductor (e.g., N-type gallium nitride)) facing up for light emission. To avoid light-blocking on the light-emitting surface, the N-side light-emitting surface usually uses a transparent electrode (e.g., indium tin oxide (ITO)) for conduction. However, due to the significant difference in work function between indium tin oxide and N-type gallium nitride, a metal electrode is still needed to form a good ohmic contact with the N-side, which will lose some of its light-emitting area.

Furthermore, since the patterning process usually uses wet etching, its process characteristics will cause the micro light-emitting elements on the circuit substrate to present an undercut structure. The cross-sectional shape of the undercut structure makes it difficult for the transparent electrode to form well during deposition (for example, causing an open circuit); if the deposition thickness is increased to compensate, the light extraction efficiency will further decrease, due to the incomplete transparency of indium tin oxide.

Therefore, the design and manufacturing of micro light-emitting elements and the micro light-emitting display devices that include the same still face various challenges.

BRIEF SUMMARY OF THE INVENTION

According to some embodiments of the present disclosure, a light-emitting element, a micro light-emitting display device including the same, and a method for manufacturing the same are provided. The micro light-emitting element includes a metal reflecting layer that laterally covers the sidewalls of the intrinsic semiconductor and a portion of the second-type semiconductor adjacent to the intrinsic semiconductor. This significantly increases the conductive area without covering the light-emitting surface, thereby increasing the light extraction efficiency. Moreover, since the metal reflecting layer conducts only from the sidewalls, its thickness does not affect light shading. Hence, the thickness of the metal reflecting layer is not restricted, effectively reducing the risk of an open circuit.

Furthermore, in some embodiments, the patterned light-guiding structure is part of the intrinsic semiconductor. The pattern of the patterned light-guiding structure corresponds to the surface shape of the epitaxial substrate, meaning that the light-guiding structure of the micro light-emitting element according to some embodiments of the present disclosure does not need to be separately manufactured by dry etching. As a result, the top shape and thickness of each micro light-emitting element may be substantially uniform, thereby improving the light-guiding effect and providing more consistent overall light patterns.

Some embodiments of the present disclosure include a micro light-emitting element. The micro light-emitting element includes a first-type semiconductor having a bottom surface and a light-emitting layer disposed on the first-type semiconductor. The micro light-emitting element also includes a second-type semiconductor disposed on the light-emitting layer and an intrinsic semiconductor disposed on the second-type semiconductor and made of the same material as the second-type semiconductor. The intrinsic semiconductor has a top surface relative to the bottom surface. The sidewalls of the first-type semiconductor, the light-emitting layer, the second-type semiconductor, and the intrinsic semiconductor form a continuous side surface, and the side surface connects the bottom surface to the top surface. The micro light-emitting element further includes a metal reflecting layer disposed on the side surface and laterally covering the sidewalls of the intrinsic semiconductor and the portion of the second-type semiconductor that is adjacent to the intrinsic semiconductor.

Some embodiments of the present disclosure also include a micro light-emitting display device. The micro light-emitting display device includes a driving substrate and micro light-emitting elements. The driving substrate includes pads, and the micro light-emitting elements are respectively connected to one pad and controlled by the driving substrate. The micro light-emitting element includes a first-type semiconductor having a bottom surface and a light-emitting layer disposed on the first-type semiconductor. The micro light-emitting element also includes a second-type semiconductor disposed on the light-emitting layer and an intrinsic semiconductor disposed on the second-type semiconductor and made of the same material as the second-type semiconductor. The intrinsic semiconductor has a top surface relative to the bottom surface. Sidewalls of the first-type semiconductor, the light-emitting layer, the second-type semiconductor, and the intrinsic semiconductor form a continuous side surface, and the side surface connects the bottom surface to the top surface. The micro light-emitting element further includes a metal reflecting layer disposed on the side surface and laterally covering the sidewalls of the intrinsic semiconductor and a portion of the second-type semiconductor adjacent to the intrinsic semiconductor. Moreover, the micro light-emitting element includes a patterned light-guiding structure disposed on the top surface of the intrinsic semiconductor. The distance between the patterned light-guiding structure and the driving substrate is consistent.

Some embodiments of the present disclosure further include a method for manufacturing a micro light-emitting element. The method for manufacturing the micro light-emitting element includes the following steps. An epitaxial stack is formed on a growth substrate. The epitaxial stack includes an intrinsic semiconductor, a second-type semiconductor, a light-emitting layer, and a first-type semiconductor that are sequentially stacked. The epitaxial stack is patterned to form multiple epitaxial units. An insulating layer is formed on the epitaxial units. The epitaxial units are transferred to a temporary carrier. The epitaxial units are arranged on the temporary carrier via an adhesive layer. Part of the adhesive layer and part of the insulating layer are removed to expose the sidewall of the intrinsic semiconductor and the sidewall of at least a portion of the second-type semiconductor adjacent to the intrinsic semiconductor. A metal reflecting layer is formed on exposed sidewalls of the intrinsic semiconductor and the second-type semiconductor of each epitaxial unit.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
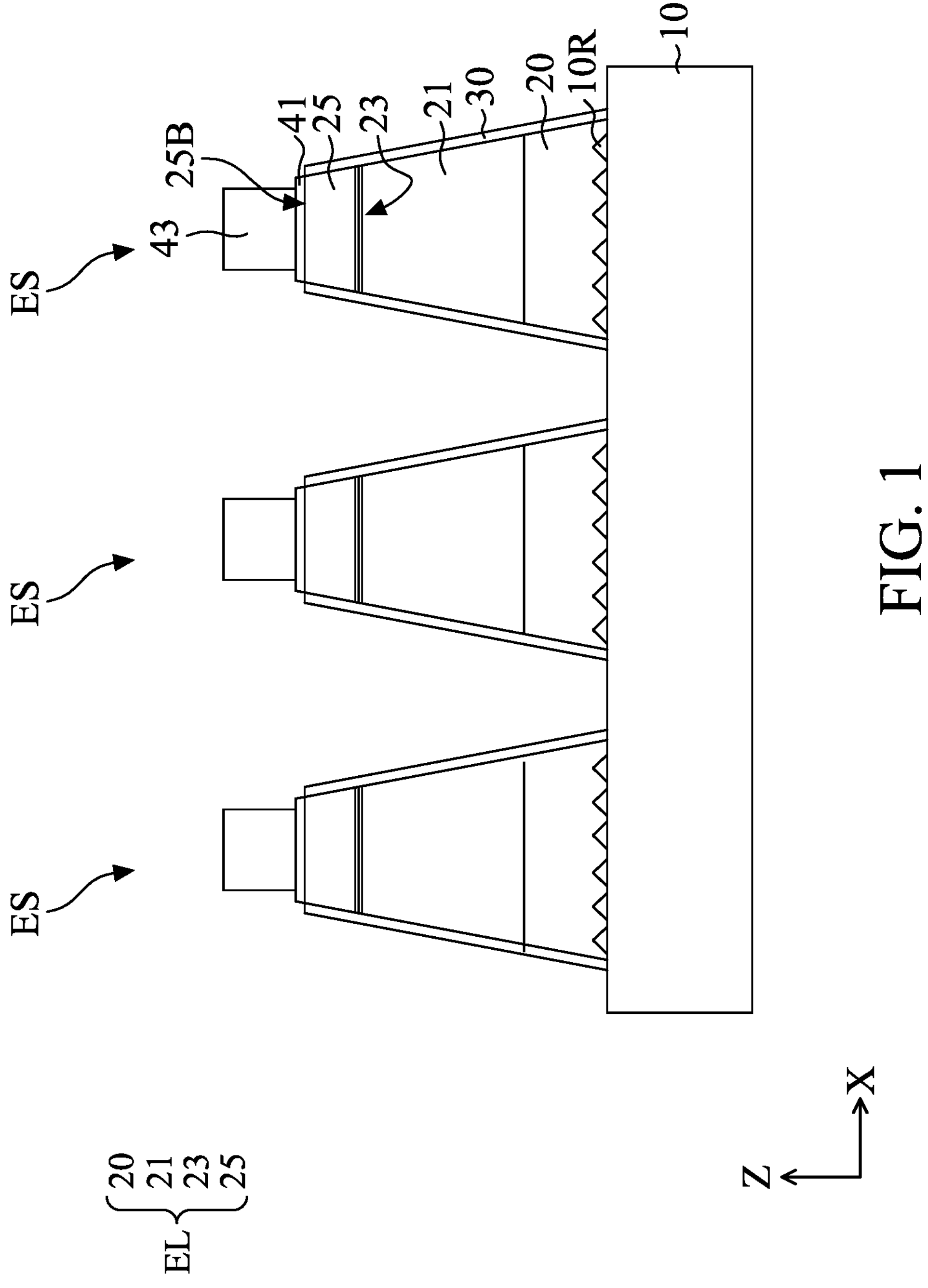
FIG. 1 to FIG. 3 are partial cross-sectional views illustrating a method for manufacturing a micro light-emitting element at various stages according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as “beneath,” “below,” “lower,” “on,” “above,” “upper” and the like, may be used herein for ease of description to describe one element or feature’s relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms “about,” “approximately” and “substantially” typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms “about,” “approximately” and “substantially”, the stated value includes the meaning of “about,” “approximately” or “substantially”.

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 2:
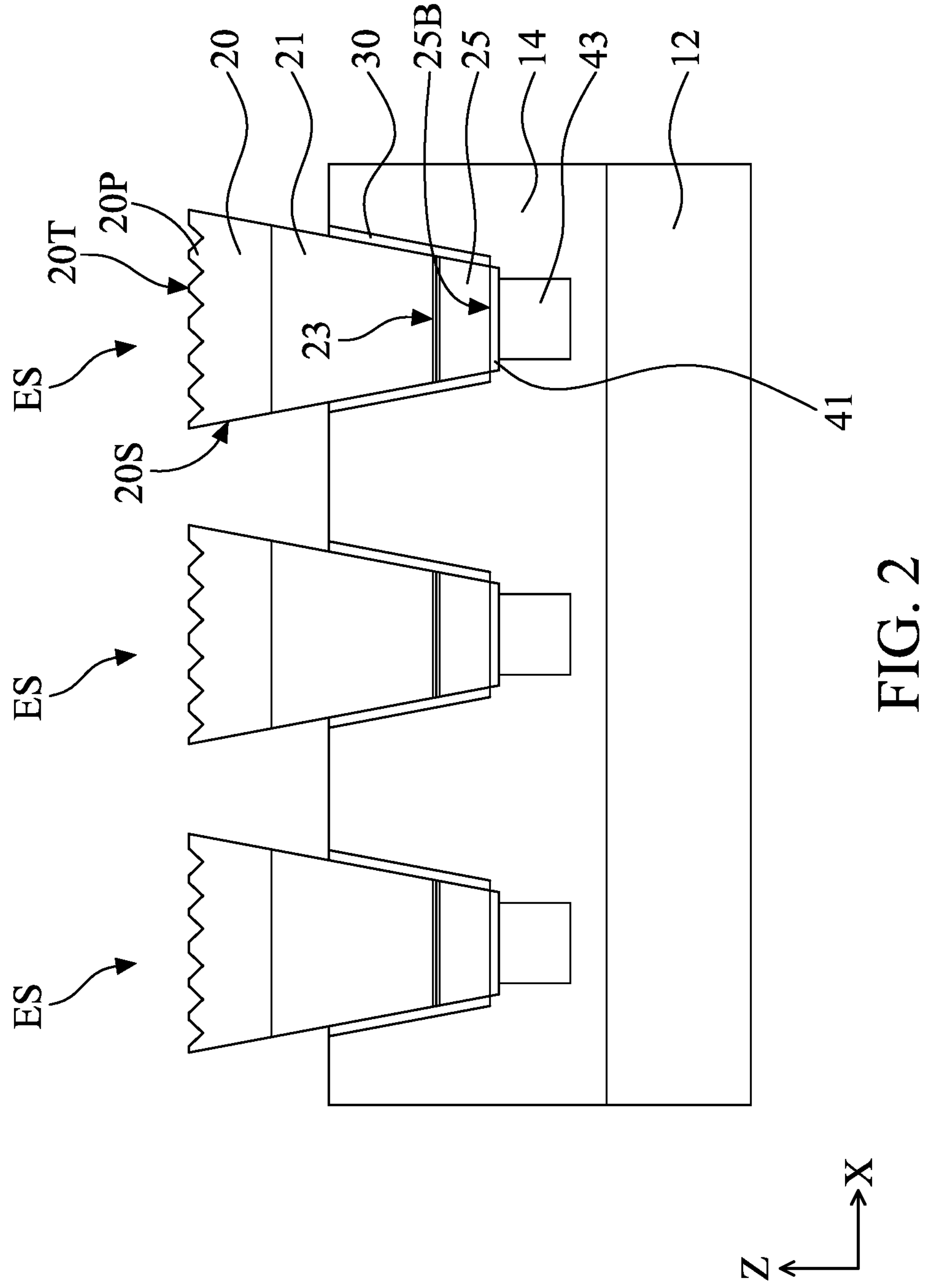
Figure 3:
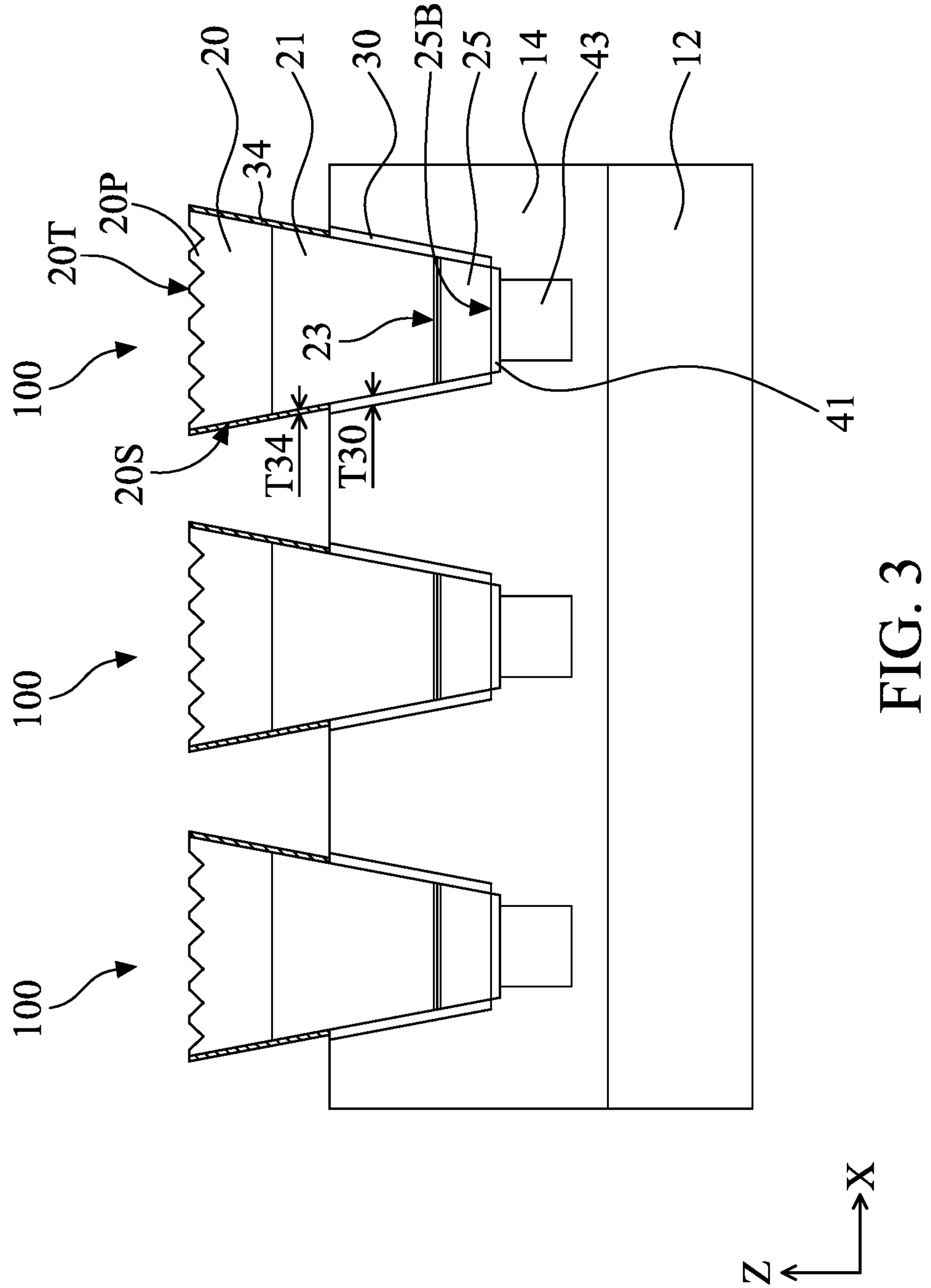

FIG. 1 to FIG. 3 are partial cross-sectional views illustrating a method for manufacturing a micro light-emitting element 100 at various stages according to some embodiments of the present disclosure. It should be noted that some components of the micro light-emitting element 100 have been omitted in FIG. 1 to FIG. 3 for the sake of brevity.

Referring to FIG. 1, in some embodiments, an epitaxial stack EL is formed on a growth substrate 10. In some embodiments, the growth substrate 10 is a patterned sapphire substrate (PSS). For example, the sapphire substrate may be patterned by a wet chemical etching process to form multiple patterned structures 10R on the surface of the sapphire substrate. The wet chemical etching process may use hot phosphoric acid as an etchant, but the present disclosure is not limited thereto.

As shown in FIG. 1, in some embodiments, the epitaxial stack EL includes an intrinsic semiconductor 20, a second-type semiconductor 21, a light-emitting layer 23, and a first-type semiconductor 25 that are sequentially stacked. The intrinsic semiconductor 20, the second-type semiconductor 21, the light-emitting layer 23, and the first-type semiconductor 25 may be sequentially formed on the growth substrate 10 by an epitaxial growth process. For example, the epitaxial growth process may include metal organic chemical vapor deposition (MOCVD), hydride vapor phase epitaxy (HVPE), molecular beam epitaxy (MBE), any other suitable method, or a combination thereof.

The second-type semiconductor 21 is disposed on the intrinsic semiconductor 20 and may include the same or similar materials as the intrinsic semiconductor 20, such as group II-VI materials (e.g., zinc selenide (ZnSe)) or group III-V nitride compound materials (e.g., gallium nitride (GaN), aluminum nitride (AlN), indium nitride (InN), indium gallium nitride (InGaN), aluminum gallium nitride (AlGaN), or aluminum indium gallium nitride (AlInGaN)). In this embodiment, the intrinsic semiconductor 20 is an undoped semiconductor layer or a lightly doped semiconductor layer, while the second-type semiconductor 21 includes N-type semiconductor material. For instance, the second-type semiconductor 21 may include dopants such as silicon (Si) or germanium (Ge), but the present disclosure is not limited thereto. The intrinsic semiconductor 20 and the second-type semiconductor 21 may be a single-layer structure or a multi-layer structure.

Since the lattice constants and the coefficients of thermal expansion (CTE) of the epitaxial materials (e.g., GaN) differ significantly from those of the growth substrate 10, high-density thread dislocations may occur. In this embodiment, the intrinsic semiconductor 20 may act as a buffer layer that may reduce dislocation defects in subsequent epitaxial layers, improving the reliability of the component. Moreover, the patterned structures 10R of the patterned sapphire (PSS) substrate may change the scattering mechanism of subsequent epitaxial layers or guide scattered light to the exterior of the epitaxial layers, thereby increasing brightness.

The light-emitting layer 23 is disposed on the second-type semiconductor 21. The light-emitting layer 23 may include an undoped semiconductor layer or a lightly doped semiconductor layer. For example, the light-emitting layer 23 may be a quantum well (QW) layer, which may include indium gallium nitride ($In_xGa_{1-x}N$) or gallium nitride (GaN), but the present disclosure is not limited thereto. Alternatively, the light-emitting layer 23 may also be a multiple quantum well (MQW) layer.

The light-emitting layer 23 may emit blue light, but the present disclosure is not limited thereto. The light-emitting layer 23 may also emit red light, green light, white light, cyan light, magenta light, yellow light, any other suitable color, or a combination thereof.

The first-type semiconductor 25 is disposed on the light-emitting layer 23 and is opposite to the second-type semiconductor 21. The first-type semiconductor 25 includes P-type semiconductor material. For example, the first-type semiconductor 25 may include dopants such as magnesium (Mg) or carbon (C), but the present disclosure is not limited thereto. Moreover, the first-type semiconductor 25 may be a single-layer structure or a multi-layer structure.

As shown in FIG. 1, in some embodiments, the epitaxial stack EL is patterned to form multiple epitaxial units ES (only three are shown in FIG. 1). For example, a mask layer (not shown) could be formed over top of the epitaxial stack EL, followed by etching the portions of the epitaxial stack EL that are covered (or not covered) by the mask layer to form multiple epitaxial units ES, but the present disclosure is not limited thereto. In other words, each epitaxial unit ES also includes an intrinsic semiconductor 20, a second-type semiconductor 21, a light-emitting layer 23, and a first-type semiconductor 25 that are sequentially stacked.

The mask layer may include photoresist, such as positive photoresist or negative photoresist. The mask layer may include a hard mask and may be formed from silicon dioxide ($SiO_2$), silicon nitride (SiN), silicon oxynitride (SiON), silicon carbide (SiC), silicon carbonitride (SiCN), similar materials, or a combination thereof, but the present disclosure is not limited thereto. The mask layer may be a single-layer structure or a multi-layer structure. The formation of the mask layer may include a deposition process, photolithography process, any other appropriate process, or a combination thereof. The deposition process may include spin-on coating, chemical vapor deposition, atomic layer deposition, similar processes, or a combination thereof. The photolithography process may include coating photoresist (e.g., by spin coating), soft baking, mask aligning, exposure, post-exposure baking (PEB), developing, rinsing, drying (e.g., hard baking), any other suitable process, or a combination thereof.

The aforementioned etching process may include dry etching, wet etching, or a combination thereof. For example, the dry etching process may include reactive ion etching (RIE), inductively-coupled plasma (ICP) etching, neutral beam etching (NBE), electron cyclotron resonance (ERC) etching, similar etching processes, or a combination thereof. For example, the wet etching process may use etchants such as hydrofluoric acid (HF), ammonium hydroxide ($NH_4OH$), or any suitable etchant.

Then, an insulating layer 30 is formed on the epitaxial units ES. For example, the insulating layer 30 may include inorganic insulating materials such as silicon dioxide ($SiO_2$), silicon nitride ($SiN_x$), aluminum oxide ($Al_2O_3$), titanium dioxide ($TiO_2$), similar materials, or a combination thereof, but the present disclosure is not limited thereto. The insulating layer 30 may be formed by a deposition process and a patterning process. Examples of the deposition process and the patterning process has been previously described and will not be repeated here.

As shown in FIG. 1, in some embodiments, the insulating layer 30 is patterned to expose at least a portion of the surface 25B of the first-type semiconductor 25 of each epitaxial unit ES. Then, a patterned electrode layer 41 is formed on the surface 25B of each first-type semiconductor 25. The patterned electrode layer 41 may include transparent conductive materials. For example, the transparent conductive materials may include indium tin oxide (ITO), tin oxide (TO), indium zinc oxide (IZO), indium gallium zinc oxide (IGZO), indium zinc tin oxide (ITZO), antimony tin oxide (ATO), antimony zinc oxide (AZO), but the present disclosure is not limited thereto.

As shown in FIG. 1, in some embodiments, an electrode 43 is formed on the patterned electrode layer 41 and electrically connected with the first-type semiconductor 25 by the patterned electrode layer 41. The electrode 43 may include, for example, metals, metal silicides, similar conductive materials, or a combination thereof. For example, metals may include gold (Au), nickel (Ni), platinum (Pt), palladium (Pd), iridium (Ir), titanium (Ti), chromium (Cr), tungsten (W), aluminum (Al), copper (Cu), similar materials, alloys of the aforementioned, or a combination thereof, but the present disclosure is not limited thereto. The electrode 43 may be formed by physical vapor deposition, chemical vapor deposition, atomic layer deposition, evaporation, sputtering, similar processes, or a combination thereof, but the present disclosure is not limited thereto.

Referring to FIG. 2, the epitaxial units ES are transferred from the growth substrate 10 to a temporary carrier 12. For example, the epitaxial units ES may be fixed to the temporary carrier 12 via an adhesive layer 14, and then the growth substrate 10 may be removed by a laser lift-off (LLO) process. In this state, the electrode 43 of the epitaxial unit ES is adjacent to the temporary carrier 12, while the intrinsic semiconductor 20 is far from the temporary carrier 12. The temporary carrier 12 may include a plastic substrate, a ceramic substrate, a glass substrate, a sapphire substrate, or any other substrate without circuits, but the present disclosure is not limited thereto.

As shown in FIG. 2, since the epitaxial stack EL is formed on the growth substrate 10 that includes multiple patterned structures 10R, each epitaxial unit ES also includes a patterned light-guiding structure 20P of which the shape corresponds to the patterned structures 10R. The patterned light-guiding structure 20P is disposed on the top surface 20T of the intrinsic semiconductor 20. In this embodiment, the patterned light-guiding structure 20P is a part of the intrinsic semiconductor 20. Moreover, in some embodiments, the shape of the patterned light-guiding structure 20P in the cross-section shown in FIG. 2 is periodically varying.

Then, a portion of the adhesive layer 14 and a portion of the insulating layer 30 are removed to expose the sidewall of the intrinsic semiconductor 20 and the sidewall of a portion of the second-type semiconductor 21. In some embodiments, the insulating layer 30 is a Bragg reflector structure (e.g., a distributed Bragg reflector (DBR)), but the present disclosure is not limited thereto.

For example, a reactive ion etching (RIE) process using plasma may be utilized to remove the adhesive layer 14 and the insulating layer 30 surrounding the sidewall of the intrinsic semiconductor 20 and the sidewall of a portion of the second-type semiconductor 21, but the present disclosure is not limited to this method of removing these layers. As shown in FIG. 2, in some embodiments, the sidewalls of the first-type semiconductor 25, the light-emitting layer 23, the second-type semiconductor 21, and the intrinsic semiconductor 20 of each epitaxial unit ES form a continuous side surface 20S, which connects the (bottom) surface 25B of the first-type semiconductor 25 with the top surface 20T of the intrinsic semiconductor 20.

Referring to FIG. 3, a metal reflecting layer 34 is formed on the side surfaces 20S of the multiple epitaxial units ES, which laterally covers the sidewalls of the intrinsic semiconductor 20 and a portion of the second-type semiconductor 21 adjacent to the intrinsic semiconductor 20, to form multiple micro light-emitting elements 100. For example, the metal reflecting layer 34 may be formed by evaporation, sputtering, similar processes, or a combination thereof, but the present disclosure is not limited thereto. In some embodiments, the metal reflecting layer 34 includes at least one of titanium (Ti), aluminum (Al), nickel (Ni), gold (Au), or an alloy of any combination thereof.

It should be noted that the steps shown in FIG. 1, such as patterning the insulating layer 30 to expose at least part of the surface 25B of the first-type semiconductor 25, forming a patterned electrode layer 41 on the epitaxial units ES, and forming an electrode 43 on the patterned electrode layer 41, may also be performed after the formation of the metal reflecting layer 34. Specifically, these processes may be performed after the formation of the metal reflecting layer 34 in FIG. 3 and after transferring these micro light-emitting elements 100 to another temporary carrier (not shown) to remove the remaining adhesive layer 14.

As shown in FIG. 3, the insulating layer 30 is disposed on the side surface 20S and laterally covers the sidewalls of the first-type semiconductor 25, the light-emitting layer 23, and another portion of the second-type semiconductor 21 away from the intrinsic semiconductor 20. In this embodiment, the metal reflecting layer 34 is adjacent to the insulating layer 30 on the side surface 20S. Moreover, in other embodiments, the metal reflecting layer 34 may also surround the entire side surface 20S and laterally enclose the sidewalls of the intrinsic semiconductor 20 and the portion of the second-type semiconductor 21.

As shown in FIG. 3, in some embodiments, the metal reflecting layer 34 follows the profile of the insulating layer 30 or slightly overlaps the insulating layer 30 at the junction, which may be determined by whether the adhesive layer 14 exposes the insulating layer 30 and the height of the exposure. In some embodiments, the thickness T30 of the insulating layer 30 is greater than the thickness T34 of the metal reflecting layer 34. For example, the thickness T30 of the insulating layer 30 may be about 1 μm, while the thickness T34 of the metal reflecting layer 34 may be about 0.1 μm to about 0.3 μm, but the present disclosure is not limited thereto.

Figure 4A:
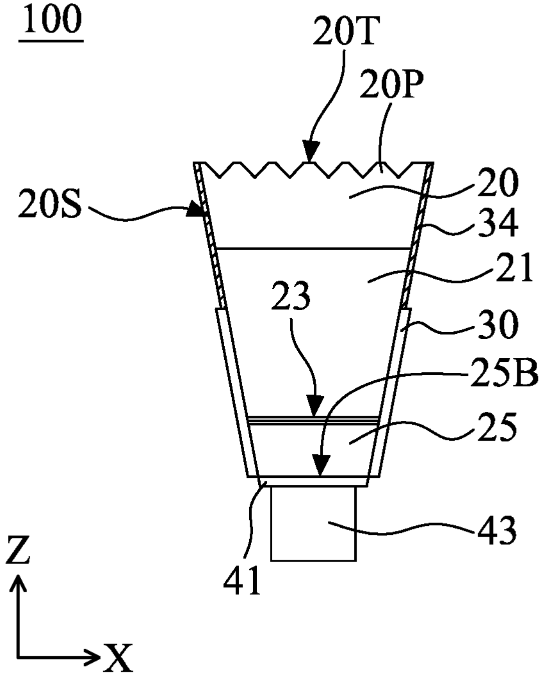
FIG. 4A is a partial cross-sectional view illustrating a micro light-emitting element according to some embodiments of the present disclosure.
Figure 4B:
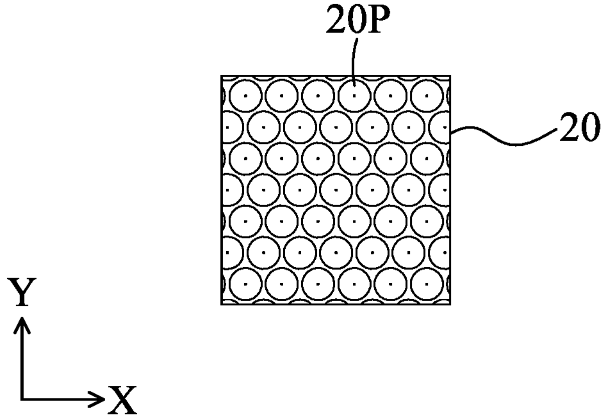
FIG. 4B is a partial top view illustrating the intrinsic semiconductor of the micro light-emitting element.
Figure 5A:
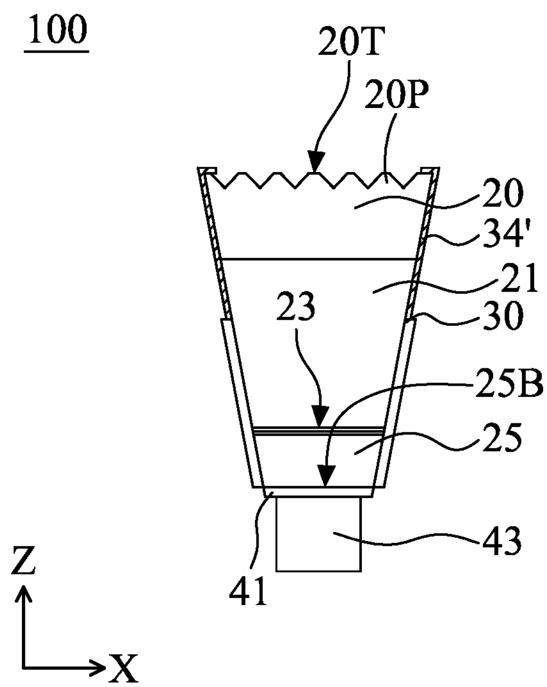
FIG. 5A is a partial cross-sectional view illustrating a micro light-emitting element according to some other embodiments of the present disclosure.
Figure 5B:
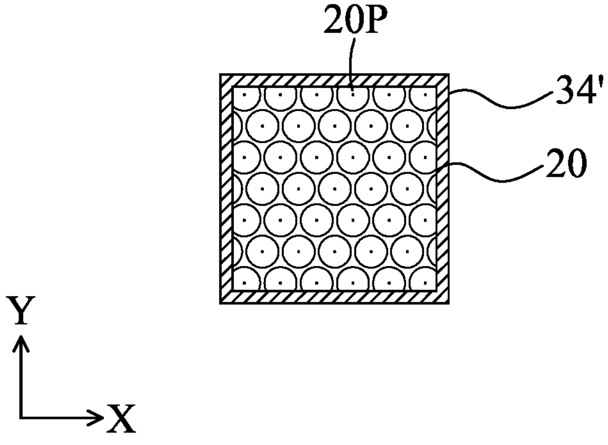
FIG. 5B is a partial top view illustrating the intrinsic semiconductor and the metal reflecting layer of the micro light-emitting element.

FIG. 4A is a partial cross-sectional view illustrating a micro light-emitting element 100 according to some embodiments of the present disclosure. FIG. 4B is a partial top view illustrating the intrinsic semiconductor 20 of the micro light-emitting element 100. FIG. 5A is a partial cross-sectional view illustrating a micro light-emitting element 100 according to some other embodiments of the present disclosure. FIG. 5B is a partial top view illustrating the intrinsic semiconductor 20 and the metal reflecting layer 34 of the micro light-emitting element 100. Similarly, some components of the micro light-emitting element 100 have been omitted in FIG. 4A to FIG. 5B for the sake of brevity.

Referring to FIG. 4A, similarly, the micro light-emitting element 100 includes a first-type semiconductor 25 and a light-emitting layer 23. The first-type semiconductor 25 has a (bottom) surface 25B, and the light-emitting layer 23 is disposed on the first-type semiconductor 25. The micro light-emitting element 100 also includes a second-type semiconductor 21 and an intrinsic semiconductor 20. The second-type semiconductor 21 is disposed on the light-emitting layer 23, and the intrinsic semiconductor 20 is disposed on the second-type semiconductor 21 and made of the same material as the second-type semiconductor 21. The intrinsic semiconductor 20 has a top surface 20T relative to the (bottom) surface 25B of the first-type semiconductor 25. The sidewalls of the first-type semiconductor 25, the light-emitting layer 23, the second-type semiconductor 21, and the intrinsic semiconductor 20 form a continuous side surface 20S, and the continuous side surface 20S connects the (bottom) surface 25B to the top surface 20T. The micro light-emitting element 100 further includes a metal reflecting layer 34 disposed on the side surface 20S and laterally covers the sidewalls of the intrinsic semiconductor 20 and a portion of the second-type semiconductor 21 adjacent to the intrinsic semiconductor 20.

As shown in the cross-section in FIG. 4A, the width of the intrinsic semiconductor 20 is greater than the width of the second-type semiconductor 21, and the width of the second-type semiconductor 21 is greater than the width of the first-type semiconductor 25. In other words, in the cross-section of the micro light-emitting element 100, the micro light-emitting element 100 overall may present a shape that is wider at the top and narrower at the bottom. Here, the width of the intrinsic semiconductor 20, the width of the second-type semiconductor 21, and the width of the first-type semiconductor 25 refer to the average width of these components in the X direction or the width at any given point.

As shown in FIG. 4A and FIG. 4B, the metal reflecting layer 34 extends from the sidewall of the intrinsic semiconductor 20 towards the top surface 20T of the intrinsic semiconductor 20, and stops at the location where the side surface 20S is adjacent to the top surface 20T, thereby exposing the top surface 20T. In other words, the metal reflecting layer 34 does not cover the top surface 20T of the intrinsic semiconductor 20 and the patterned light-guiding structure 20P on the top surface 20T, but the present disclosure is not limited thereto.

As shown in FIG. 5A and FIG. 5B, compared to FIG. 4A and FIG. 4B, the metal reflecting layer 34' extends from the sidewall of the intrinsic semiconductor 20 towards the top surface 20T of the intrinsic semiconductor 20, and covers the peripheral region of the patterned light-guiding structure 20P. The area of the peripheral region occupies for example, less than 10% of the area of surface 20T. In other words, the metal reflecting layer 34' covers part of the top surface 20T of the intrinsic semiconductor 20 and (part of) the patterned light-guiding structure 20P on the top surface 20T.

Figure 6:
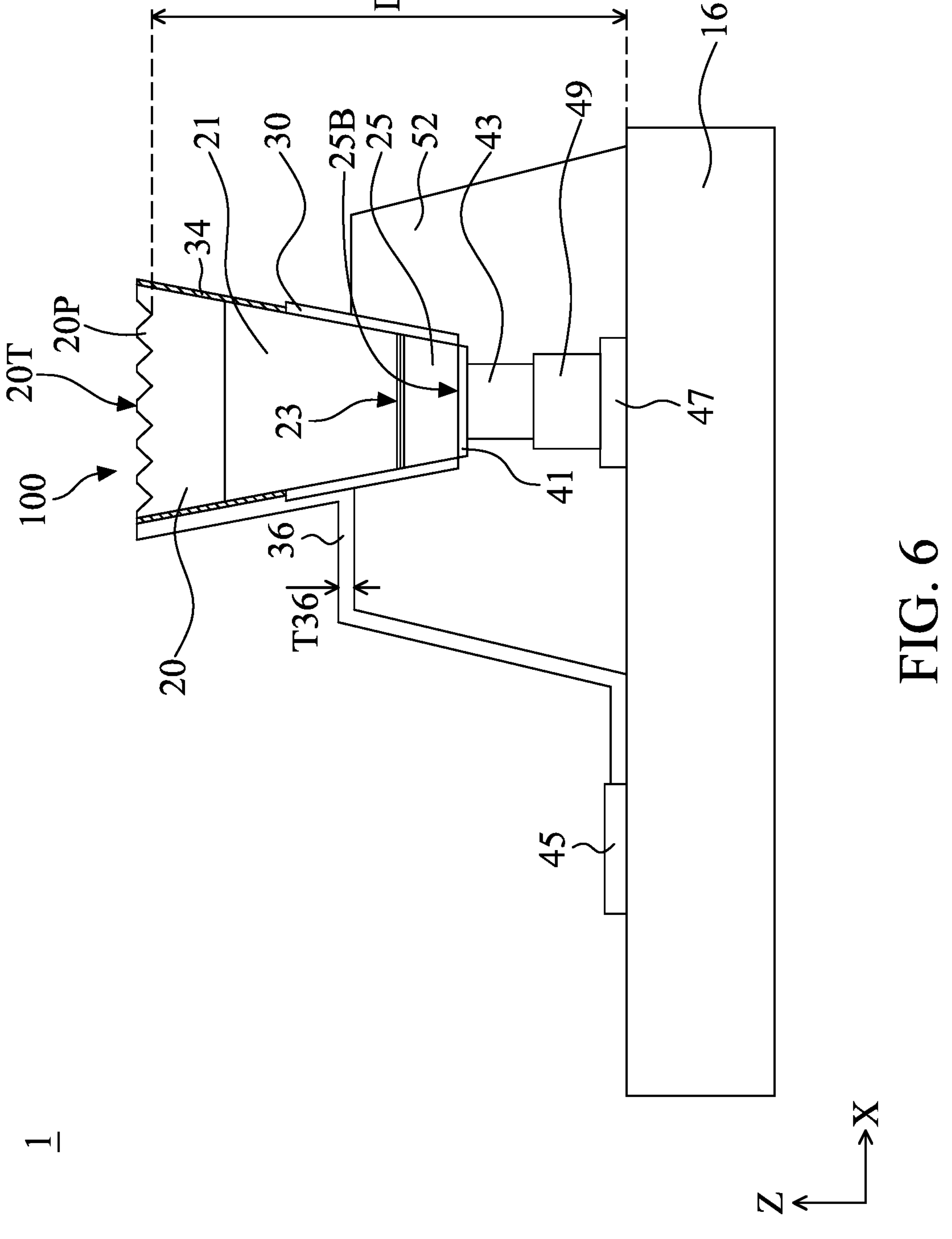
FIG. 6 is a partial cross-sectional view illustrating a micro light-emitting display device according to some embodiments of the present disclosure.

FIG. 6 is a partial cross-sectional view illustrating a micro light-emitting display device 1 according to some embodiments of the present disclosure. For example, the micro light-emitting display device 1 may be a micro light-emitting display panel or a micro light-emitting display, but the present disclosure is not limited thereto. Similarly, some components of the micro light-emitting display device 1 have been omitted in FIG. 6 for the sake of brevity.

Referring to FIG. 6, the micro light-emitting display device 1 includes a driving substrate 16, multiple pads 49, and multiple micro light-emitting elements 100 (only one pad 49 and one micro light-emitting element 100 are shown in FIG. 6), each micro light-emitting element 100 is connected to a pad 49 and controlled by the driving substrate 16. For example, the driving substrate 16 may be a display substrate, a light-emitting substrate, a substrate with functional components such as thin-film transistors (TFTs) or integrated circuits (ICs), or other types of circuit substrates, and the micro light-emitting elements 100 are disposed on and electrically connected to the driving substrate 16. The driving substrate 16 may be, for example, a rigid circuit substrate that may include elemental semiconductors (e.g., silicon or germanium), compound semiconductors (e.g., silicon carbide (SiC), gallium arsenide (GaAs), indium arsenide (InAs), or indium phosphide (InP)), alloy semiconductors (e.g., SiGe, SiGeC, GaAsP, or GaInP), other appropriate semiconductors, or a combination thereof. Alternatively, the driving substrate 16 may also be a flexible circuit substrate, a semiconductor-on-insulator (SOI) substrate, or other similar substrates.

Additionally, the driving substrate 16 may include various conductive components (e.g., conductive lines 45, 47, or vias). For example, these conductive components may include aluminum (Al), copper (Cu), tungsten (W), their alloys, other appropriate conductive materials, or a combination thereof. In the example where the driving substrate 16 is a display substrate, the driving substrate 16 may further be joined with an external circuit (not shown) to drive and operate the micro light-emitting elements 100. Embodiments of the micro light-emitting element 100 are as previously described and will not be repeated here.

Referring to the cross-section shown in FIG. 6, it is understood from the previous descriptions that since the patterned light-guiding structure 20P is directly formed corresponding to the patterned structures 10R of the growth substrate 10 without an additional etching process, the distance D between each patterned light-guiding structure 20P on the top surface 20T of the intrinsic semiconductor 20 and the driving substrate 16 may be consistent. Moreover, these patterned light-guiding structures 20P have the same shape, size, and arrangement period, ensuring consistency in the light pattern of each micro light-emitting element 100.

In some embodiments, each micro light-emitting element 100 further includes a conductive connector 36 that electrically connects the metal reflecting layer 34 to the driving substrate 16, and the top surface 20T of the intrinsic semiconductor 20 is exposed relative to the conductive connector 36. The conductive connector 36 may include the metals listed for the aforementioned electrode 43 or the metal reflecting layer 34, and the thickness T36 of the conductive connector 36 may be greater than about 0.5 μm, for example, about 1 μm. The conductive connector 36 connects from one side of the micro light-emitting element 100 and covers a portion of the metal reflecting layer 34, exposing another portion of the metal reflecting layer 34, but the present disclosure is not limited thereto.

As shown in the example in FIG. 6, the electrode 43 is electrically connected through the pad 49 to the conductive line 47; the metal reflecting layer 34 serves as another electrode of the micro light-emitting element 100, which is electrically connected through the conductive connector 36 to the conductive line 45, thereby controlling the micro light-emitting element 100 by the driving substrate 16. Additionally, the micro light-emitting display device 1 also includes an insulator 52 that is disposed around a portion of the sidewall of the insulating layer 30 and between the first-type semiconductor 25 and the driving substrate 16. The insulator 52, for example, may be a structural photoresist and may serve as a mesa layer for the deposition of the conductive connector 36.

In the embodiments of the present disclosure, since the conductive connector 36 conducts only from the side of the metal reflecting layer 34 of the micro light-emitting element 100, it does not block the light emitted from the top surface 20T, thus the thickness T36 of the conductive connector 36 may be unrestricted. Compared to existing vertically stacked micro light-emitting elements, this effectively reduces the risk of an open circuit in the thin transparent conductive layer.

Moreover, conducting electricity by surrounding the sidewalls of the micro light-emitting element 100 with the metal reflecting layer 34 significantly increases the conductive area, improving the electrical performance of the micro light-emitting element 100. Furthermore, since the patterned light-guiding structure 20P of each micro light-emitting element 100 is formed based on the patterned structures 10R of the growth substrate 10, as opposed to existing micro light-emitting elements that remove the intrinsic semiconductor 20 by etching down to the second-type semiconductor 21, the micro light-emitting element 100 offers better light-guiding effects, and each micro light-emitting element 100 may have substantially the same height, ensuring uniformity in the overall light shape.

Figure 7:
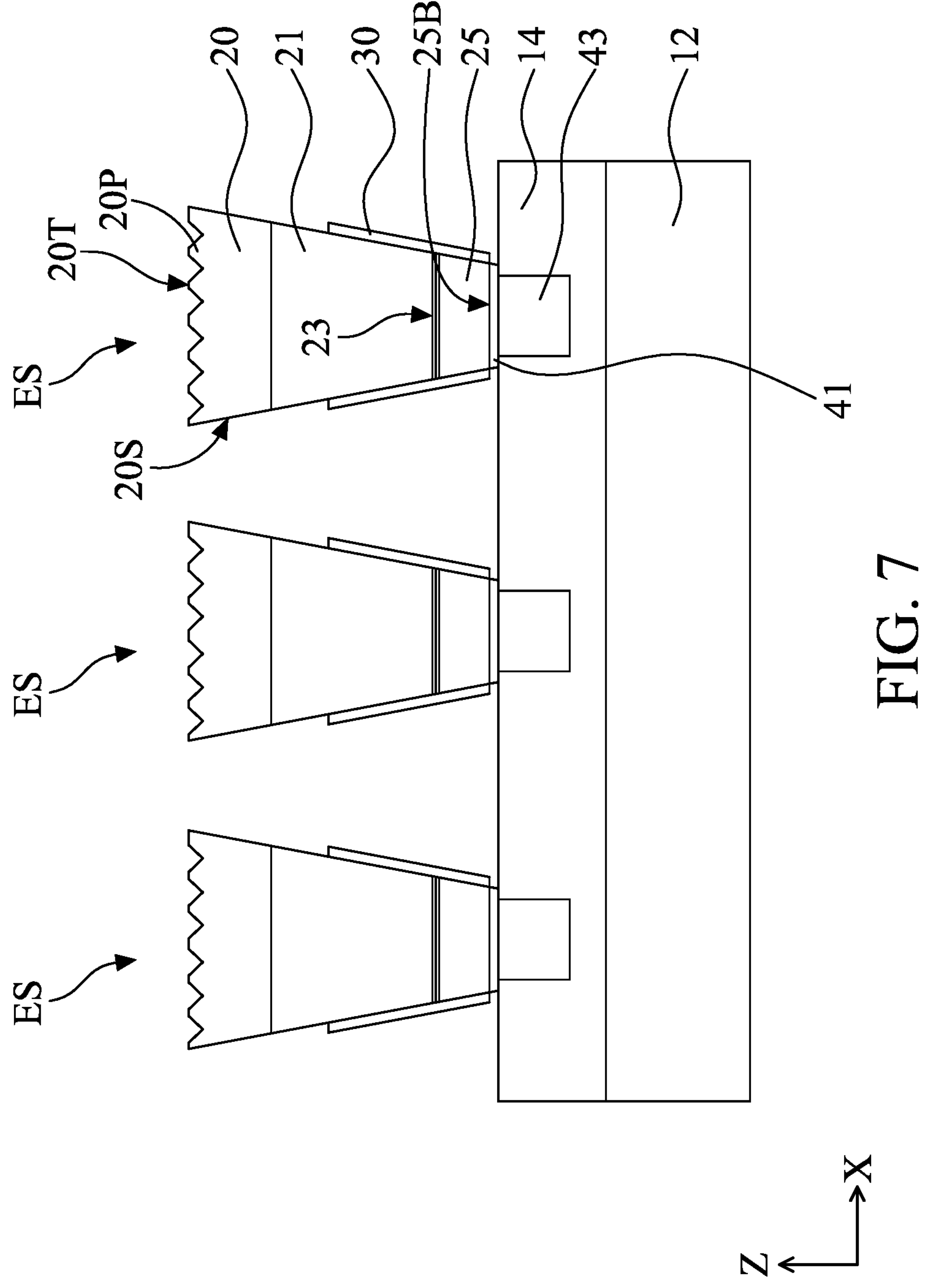
FIG. 7 and FIG. 8 are partial cross-sectional views illustrating a method for manufacturing the micro light-emitting element at various stages according to some other embodiments of the present disclosure.
Figure 8:
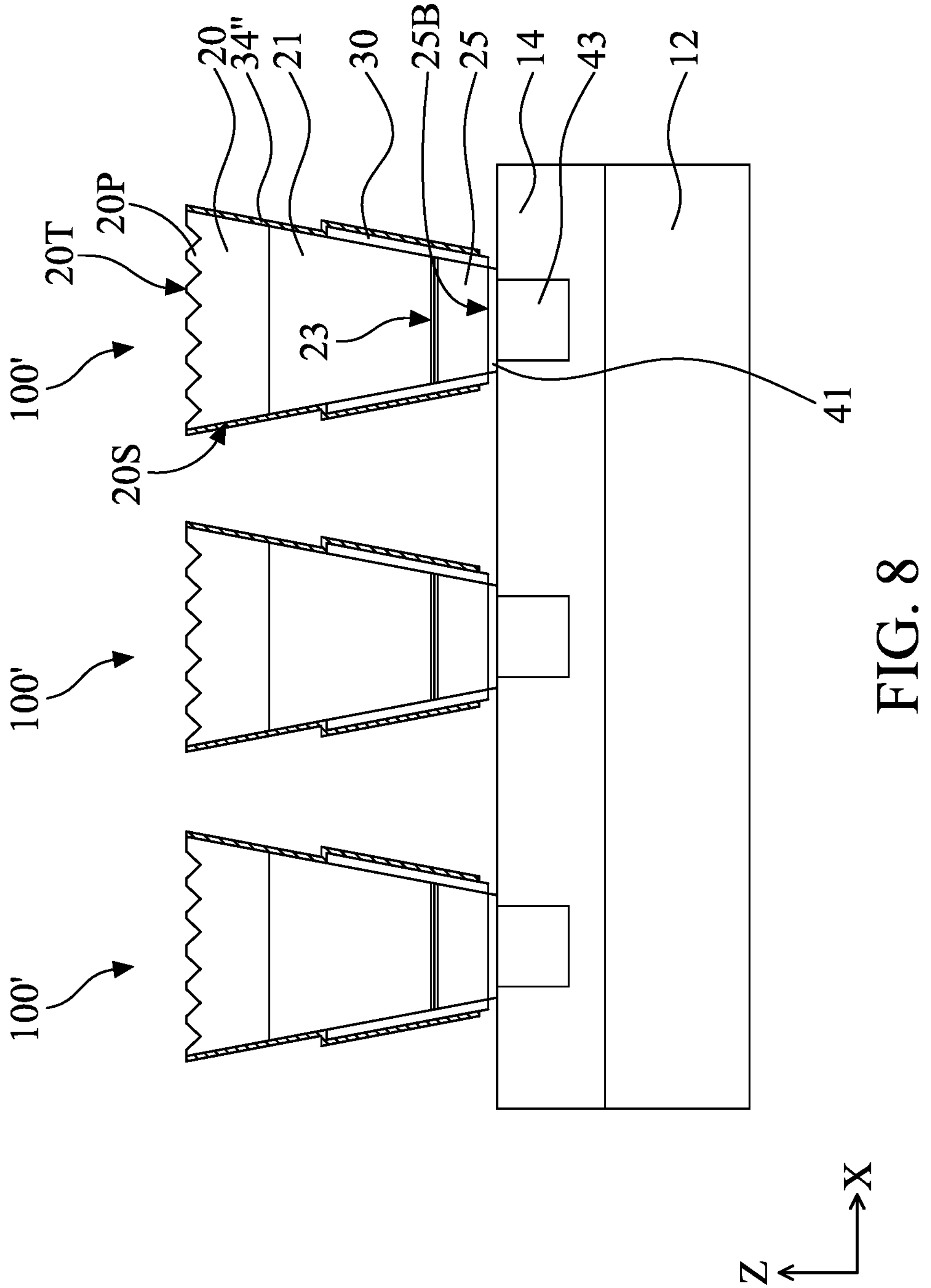

FIG. 7 and FIG. 8 are partial cross-sectional views illustrating a method for manufacturing the micro light-emitting element 100' at various stages according to some other embodiments of the present disclosure. For example, the steps shown in FIG. 7 may follow those shown in FIG. 2, but the present disclosure is not limited thereto. Similarly, some components of the micro light-emitting element 100' have been omitted in FIG. 7 and FIG. 8 for the sake of brevity.

Referring to FIG. 7, in some embodiments, after removing a portion of the adhesive layer 14 and the insulating layer 30, more of the adhesive layer 14 is removed to expose the corresponding parts of the insulating layer 30. For example, wet etching may be used to remove more of the adhesive layer 14 with etching selectivity but without removing the insulating layer 30, so that most of the insulating layer 30 may be retained.

Referring to FIG. 8, which continues the embodiment from FIG. 7, a metal reflecting layer 34" is formed on the side surfaces 20S of multiple epitaxial units ES and the insulating layer 30. Due to the reduced height of the adhesive layer 14, the metal reflecting layer 34" may laterally cover the sidewall of the intrinsic semiconductor 20, the sidewall of the second-type semiconductor 21, the sidewall of the light-emitting layer 23, and the sidewall of the first-type semiconductor 25 (as well as the insulating layer 30), to form multiple micro light-emitting elements 100'. The metal reflecting layer 34" has a high reflective effect, and only a single deposition (for example, vapor deposition, sputtering, similar processes, or a combination thereof) is required to form a film layer with a thickness of about 0.1 μm to 0.3 μm. Moreover, in this embodiment, since the metal reflecting layer 34" covers a larger area of the side surface 20S, the reflective function of the micro light-emitting element 100' may be fully realized by the metal reflecting layer 34". Therefore, the insulating layer 30 may be formed by rapid sputtering to achieve sufficient thickness in a single layer, thereby replacing the Bragg reflector structure, which is more costly to produce.

As noted above, the micro light-emitting element according to the embodiments of the present disclosure includes a metal reflecting layer that laterally covers the sidewalls of the intrinsic semiconductor and a portion of the second-type semiconductor adjacent to the intrinsic semiconductor. This significantly increases the conductive area without covering the light-emitting surface, thereby increasing the light extraction efficiency. Moreover, since the metal reflecting layer conducts only from the sidewalls and its thickness does not affect the light blocking, the thickness is not limited, effectively reducing the risk of an open circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A micro light-emitting element, comprising:

a first-type semiconductor having a bottom surface;

a light-emitting layer disposed on the first-type semiconductor;

a second-type semiconductor disposed on the light-emitting layer;

an intrinsic semiconductor disposed on the second-type semiconductor and made of the same material as the second-type semiconductor, wherein the intrinsic semiconductor has a top surface relative to the bottom surface, sidewalls of the first-type semiconductor, the light-emitting layer, the second-type semiconductor, and the intrinsic semiconductor form a continuous side surface, and the side surface connects the bottom surface to the top surface; and a metal reflecting layer disposed on the side surface and laterally covering the sidewalls of the intrinsic semiconductor and a portion of the second-type semiconductor adjacent to the intrinsic semiconductor.

2. The micro light-emitting element as claimed in claim 1, further comprising:

an insulating layer disposed on the side surface and laterally covering the sidewalls of the first-type semiconductor, the light-emitting layer, and another portion of the second-type semiconductor away from the intrinsic semiconductor.

3. The micro light-emitting element as claimed in claim 2, wherein the metal reflecting layer is adjacent to the insulating layer on the side surface, or the metal reflecting layer covers at least a portion of the insulating layer on the side surface.

4. The micro light-emitting element as claimed in claim 2, wherein the insulating layer is a Bragg reflector structure.

5. The micro light-emitting element as claimed in claim 2, wherein a thickness of the insulating layer is greater than a thickness of the metal reflecting layer.

6. The micro light-emitting element as claimed in claim 1, further comprising:

a patterned light-guiding structure disposed on the top surface of the intrinsic semiconductor.

7. The micro light-emitting element as claimed in claim 6, wherein the patterned light-guiding structure is part of the intrinsic semiconductor.

8. The micro light-emitting element as claimed in claim 6, wherein in a cross-section, a shape of the patterned light-guiding structure changes periodically.

9. The micro light-emitting element as claimed in claim 6, wherein the metal reflecting layer extends from the sidewall of the intrinsic semiconductor towards the top surface and covers an outer region of the patterned light-guiding structure, and a surface area of the outer region is less than 10% of a surface area of the top surface.

10. The micro light-emitting element as claimed in claim 1, wherein in a cross-section of the micro light-emitting element, a width of the intrinsic semiconductor is greater than a width of the second-type semiconductor, and the width of the second-type semiconductor is greater than a width of the first-type semiconductor.

11. The micro light-emitting element as claimed in claim 1, wherein the metal reflecting layer extends from the sidewall of the intrinsic semiconductor towards the top surface and is cut off at a place where the side surface is adjacent to the top surface, exposing the top surface.

12. The micro light-emitting element as claimed in claim 1, wherein the metal reflecting layer comprises titanium, aluminum, nickel, gold, an alloy thereof, or a combination thereof.

13. The micro light-emitting element as claimed in claim 1, wherein the metal reflecting layer surrounds the side surface and laterally encloses the sidewalls of the intrinsic semiconductor and the portion of the second-type semiconductor.

14. A micro light-emitting display device, comprising:

a driving substrate that comprises pads; and micro light-emitting elements respectively connected to one of the pads and controlled by the driving substrate, wherein each of the micro light-emitting elements comprises:

a first-type semiconductor having a bottom surface;

a light-emitting layer disposed on the first-type semiconductor;

a second-type semiconductor disposed on the light-emitting layer;

an intrinsic semiconductor disposed on the second-type semiconductor and made of the same material as the second-type semiconductor, wherein the intrinsic semiconductor has a top surface relative to the bottom surface, sidewalls of the first-type semiconductor, the light-emitting layer, the second-type semiconductor, and the intrinsic semiconductor form a continuous side surface, and the side surface connects the bottom surface to the top surface;

a metal reflecting layer disposed on the side surface and laterally covering the sidewalls of the intrinsic semiconductor and a portion of the second-type semiconductor adjacent to the intrinsic semiconductor; and a patterned light-guiding structure disposed on the top surface of the intrinsic semiconductor;

wherein a distance between the patterned light-guiding structure and the driving substrate is consistent.

15. The micro light-emitting display device as claimed in claim 14, wherein each of the micro light-emitting elements further comprises:

a conductive connector electrically connecting the metal reflecting layer with the driving substrate, wherein the top surface of the intrinsic semiconductor is exposed relative to the conductive connector.

16. The micro light-emitting display device as claimed in claim 15, wherein the conductive connector comprises a metal material, and a thickness of the conductive connector is greater than 0.5 μm.

17. The micro light-emitting display device as claimed in claim 15, wherein the conductive connector covers a portion of the metal reflecting layer and exposes another portion of the metal reflecting layer.

18. The micro light-emitting display device as claimed in claim 14, wherein in cross-sections of the micro light-emitting elements, the patterned light-guiding structures have the same shape.

* * * * *